United States Patent [19]
Schelhorn

[11] 3,838,240
[45] Sept. 24, 1974

[54] BONDING TOOL AND METHOD OF BONDING THEREWITH

[75] Inventor: Robert Lindsey Schelhorn, Cinnaminson, N.J.

[73] Assignee: RCA Corporation, New York, N.Y.

[22] Filed: Apr. 4, 1973

[21] Appl. No.: 347,674

[52] U.S. Cl. ........................ 219/85, 29/494, 29/628, 219/119, 219/230, 219/233, 219/373, 228/44
[51] Int. Cl. ........................ B23k 19/00, H05b 1/00
[58] Field of Search ............ 219/85, 230, 233, 229, 219/373, 119; 228/3, 4, 44, 51, 52; 29/494, 498, 628

[56] References Cited

UNITED STATES PATENTS

| | | | |
|---|---|---|---|
| 3,149,510 | 9/1964 | Kulicke | 228/44 X |
| 3,179,785 | 4/1965 | Belardi et al. | 219/85 |
| 3,224,072 | 12/1965 | Summers et al. | 29/498 X |
| 3,409,977 | 11/1968 | Johnson | 228/44 X |
| 3,641,304 | 2/1972 | Angelucci | 219/85 |
| 3,650,450 | 3/1972 | Larson et al. | 219/85 X |
| 3,673,681 | 7/1972 | Steranko | 219/85 X |

*Primary Examiner*—A. Bartis
*Attorney, Agent, or Firm*—Arthur I. Spechler

[57] ABSTRACT

A thermocompression bonding tool is heated by a combination of conductive and resistive heating means. Firstly, a bonding tip of the tool is heated by conduction with heat provided by a heating coil disposed around electrodes that are adapted to conduct electric current to the bonding tip. Secondly, the bonding tip is heated resistively by current supplied to it through the electrodes. A non-oxidizing inert gas is heated by being passed over the heating coil and is directed onto the bonding tip to prevent oxidation of the bonding tip. The heated gas is also directed onto any workpiece brought adjacent to the bonding tip for bonding thereby, whereby to heat the bonding site so that a cold workpiece need not be preheated before being thermocompression bonded.

11 Claims, 4 Drawing Figures

BONDING TOOL AND METHOD OF BONDING THEREWITH

This invention relates generally to the art of bonding tools and thermocompression bonding. More particularly, the invention relates to a novel thermocompression bonding tool and a method of bonding therewith. The novel bonding tool and method are particularly useful for bonding wire or metal ribbon to unheated substrates, such as, for example, microwave integrated circuits that may be disposed in relatively inaccessible, deep-walled, heat-sensitive packages.

In the manufacture of certain hybrid and integrated circuits, wherein it is desired to bond wires to selected contacts of a circuit on a substrate by thermocompression bonding, it has been proposed to heat the entire substrate and the circuit thereon prior to the bonding operation. Usually, prior-art thermocompression bonding tools were not heated. Since the bonding operation is performed only on selected contacts that constitute only a relatively small portion of the integrated circuit, however, it is not necessary to heat the entire substrate and circuit. In fact, such an extensive heating can be detrimental to certain integrated circuits in that it may change the parameters of the circuit. Also, such heating can unsolder connections used to anchor some substrates to certain containers.

It has also been proposed to heat the bonding tips of bonding tools but such heating caused the bonding tips of high temperature operated tools to oxidize quickly, thereby shortening their usefulness.

The novel bonding tool obviates the necessity of preheating the entire workpiece (substrate and circuit thereon) and also has means for preventing the oxidation of its bonding tip.

Briefly stated, the novel bonding tool comprises a bonding tip connected between a pair of electrodes and adapted to be heated when the electrodes are connected to a source of voltage. A heating coil is disposed adjacent to, and electrically insulated from, the electrodes. Means are provided to conduct an inert gas over the heating coil and over the bonding tip to prevent oxidation thereof.

In accordance with the novel method, the heated gas passing over the bonding tip is directed to heat any cold workpiece at the bonding site when the bonding tip is brought adjacent to the bonding site for bonding thereby.

FIG. 1 of the drawing is a cross-sectional view of one embodiment of a novel thermocompression bonding tool taken along the line 1—1 in FIG. 2;

Figures 1, 2:
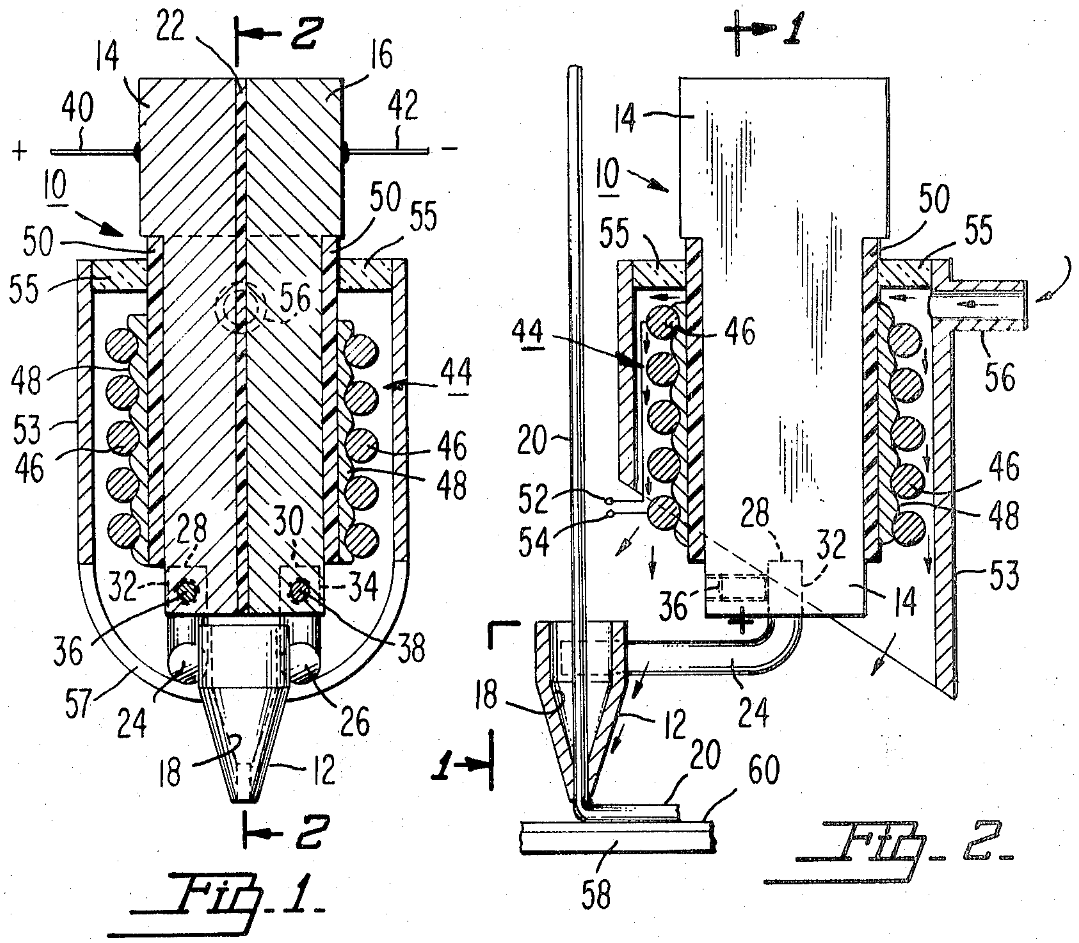
FIG. 2 is a cross-sectional drawing of the novel bonding tool, taken along the line 2—2 in FIG. 1, in position for bonding a wire to a circuit on a substrate.
Figure 3:
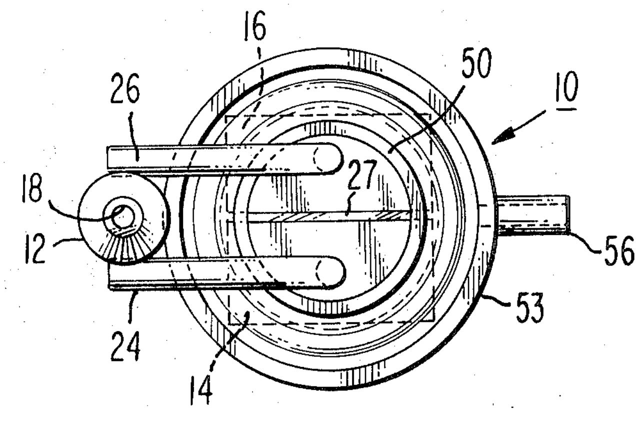
FIG. 3 is a bottom view of the novel bonding tool.

Referring now to FIGS. 1, 2 and 3 of the drawing, there is shown a preferred embodiment of a novel thermocompression bonding tool 10. The bonding tool 10 comprises a somewhat conically shaped bonding tip 12 and a pair of relatively thick, symmetrical electrodes 14 and 16. The bonding tip 12 is preferably made of tungsten and is formed with a circular through opening 18 adapted to receive a bonding wire 20 of circular cross-section therein, as shown in FIG. 2.

The electrodes 14 and 16 are elongated parallel members of gold plated copper that are separated from each other by an electrical insulator 22, such as "Teflon" (Trademark of E. I. duPont de Nemours) or beryllium oxide, for example. The upper portions of the electrodes 14 and 16 are slightly enlarged so as to form an insertion shank for attachment to a conventional thermocompression bonding machine (not shown). The thermocompression bonding machine is adapted to apply pressure downwardly to the bonding tool 10, in a manner well known in the art.

Means are provided to heat the bonding tip 12 by resistive means. To this end, the bonding tip 12 is connected between two relatively stiff wires 24 and 26 of tungsten, for example, as by welding. The wires 24 and 26 are substantially L-shaped and have ends 28 and 30 that are inserted in holes 32 and 34 in the electrodes 14 and 16, respectively, as shown in FIG. 1. The wires 24 and 26 are fastened to the electrodes 14 and 16 by set screws 36 and 38, respectively. The electrodes 14 and 16 are adapted to be connected to a source of suitable voltage, as shown schematically by wires 40 and 42 connected to the electrodes 14 and 16, respectively. Thus, the bonding tip 12 is heated by resistive means when the electrodes 14 and 16 are connected to a source of voltage (not shown) as, for example, of about ½ volt and providing a current of about 200 amperes.

Means are provided to heat the bonding tip 12 by conduction. To this end, a shank heating coil 44 is disposed around the central shank portion of the electrodes 14 and 16 and electrically insulated therefrom. The heating coil 44 comprises an insulated heating element 46 wound about a stainless steel form or sleeve 48. The form or sleeve 48 is disposed about the electrodes 14 and 16 and insulated therefrom by a good electrical insulator and good heat conductor, such as a beryllium oxide sleeve 50. Terminals 52 and 54 are connected to the opposite ends of the heating element 46, as shown schematically in FIG. 2. Thus, when the heating coil 44 is energized, as by applying 12 volts across the terminals 52 and 54 so that about 2 amperes flow through the heating element 46, for example, the heating coil is heated to between 300° and 400°C. Heat from the heating coil 44 is conducted through the heat conducting sleeve 50 so that the electrodes 14 and 16 are heated, and the heat from the electrodes 14 and 16 is further conducted to the heating tip 12 through the tungsten wires 24 and 26. Thus, the bonding tip 12 is also heated by conduction. Means are provided to prevent the bonding tip 12 from oxidizing and to heat the bonding site of a workpiece. To this end, a gas deflector or shield 53 is disposed around, and spaced from, the heating coil 44. The shield 53 is a cylindrical tube, as of stainless steel, for example, having its upper end, remote from the bonding tip 12 fixed around the electrodes 14 and 16 by electrically insulating anchoring means 55 of aluminum oxide, for example. A conduit 56 is fixed to the shield 53 adjacent to the upper portion of the heating coil 44 and communicates with the space between the shield 53 and the heating coil 44, remote from the tip 12. When a non-oxidizing inert gas, such as nitrogen or an oxide-reducing gas such as forming gas (90–95% $N_2$ and 10–5% $H_2$), for example, is passed through the conduit 56, a stream of the gas flows through the space between the shield 53 and the heating coil 44 and is heated to a temperature of between about 80° and 90°C. The size and shape of the shield 53 is such that the heated gas is conducted or deflected over the bonding tip 12 to heat it. For this purpose, the lower end 57 of the shield 53 is disposed at an angle to the axis of the tool so that an orifice directed toward the bonding tip 12 is provided.

The heated gas that flows over the bonding tip 12 also flows onto any workpiece that is to be operated upon, such as a workpiece 58 that is disposed adjacent to the bonding tool 12, as shown in FIG. 2. The workpiece 58 may comprise a substrate having a hybrid or integrated circuit including, for example, a metal layer 60 thereon. Heating the workpiece 58, by heated gas just prior to a bonding operation obviates the necessity of preheating the workpiece 58, as was usually necessary in thermocompression bonding operations of the prior art.

Figure 4:
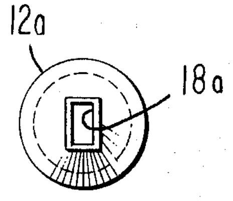
FIG. 4 is a bottom view of another embodiment of a bonding tip of the bonding tool for utilizing metal ribbon bonding material.

If the bonding tool 10 is to be used to bond with bonding material of rectangular cross-section, such as bonding ribbon, a bonding tip **12*a* formed with an axial through openings 18*a* of rectangular cross-section can be substituted for the bonding tip 12, as shown in FIG. 4**.

The operation of the bonding tool 10 is as follows: The bonding wire 20 (or ribbon if used) is threaded through the through opening 18, as shown in FIG. 3. The shank heating coil 44 is energized conductively heating the electrodes 14 and 16 and the bonding tip 12 to between approximately 300° and 400°C.

Non-oxidizing, inert gas (from any suitable source, not shown) is caused to flow over the heating coil 44, in the direction of the arrows shown in FIG. 2 so that heated gas flows over the bonding tip 12 onto the workpiece 58 to be bonded. The rate of flow of the gas is such as to cause it to be heated to between about 80° and 90°C when it passes over the heating coil 44 and the bonding tip 12. The bonding wire 20 is placed over the workpiece 58 at the bonding site (i.e., metal 60 on the workpiece 58), and the preheated gas heats the bonding site. The bonding tool 10 and the wire 20 are then brought into contact with the particular portion (bonding site) of the circuit of the workpiece 58 to be bonded. This operation now transmits additional heat conductively from the preheated bonding tip 12 to the bonding site of the workpiece 58. A bonding force (in the direction toward the workpiece 58) is now applied to the tool 10, and a high current (about 200 amperes) is passed through the tungsten bonding tip 12 for a short duration, between 0.5 and 4 seconds, depending on the size of the wire 20, to further heat the bonding tip 12. Under these conditions the bonding tip can reach a temperature of about 500°C. This heat is transferred to the bonding wire 20 and to the bonding site of the workpiece 58, causing a free flow of the bonding wire 20 and subsequent bonding of the wire 20 to the circuit on the workpiece 58.

The shank heating coil 44 preheats the bonding tip 12 and maintains it at a threshold temperature (300° – 400°C) between bonding operations. Moreover, the flow of inert gas directed to the tip 12 by the shield 53 not only supplies heat to the bonding site but also prevents the tip 12 from being oxidized at the relatively high temperatures employed during the bonding operation. The bonding tip 12 would deteriorate relatively quickly, under the aforementioned conditions in the absence of the non-oxidizing inert gas. Also, because of the localized heating of a substrate provided by the bonding tool 10, the bonding tool 10 can be inserted into deep-walled containers which ordinarily could not withstand high temperatures. Thus, the novel bonding tool 10 makes possible a greater circuit packaging flexibility, a higher component reliability, and a lower component fabrication cost than provided by previously employed unheated bonding tools.

What is claimed is:

1. A bonding tool comprising:

an electrically conductive bonding tip, a pair of electrodes, connecting means electrically and mechanically connecting said bonding tip to said electrodes so that said tip is heated by current flow therethrough when said electrodes are connected to a source of voltage, an electric heating coil disposed around, and electrically insulated from, said electrodes for heating said electrodes and said tip when said coil is energized, means connected to said coil to energize it, a shield, means disposing said shield about, and spaced from, said coil, means communicating with the space between said shield and said heating coil to introduce a gas to flow into said space to be heated by said coil, and said shield having a gas outlet oriented to direct heated gas over said tip so as to heat any workpiece brought adjacent to said tip for bonding thereby.

2. A bonding tool as described in claim 1 wherein:

said bonding tip is substantially conical in shape and has an axial through opening of circular cross-section for receiving bonding wire of circular cross-section therethrough, and said gas is a non-oxidizing gas to prevent oxidation of said tip.

3. A bonding tool as described in claim 1 wherein:

said bonding tip is substantially conical in shape and has an axial through opening of rectangular cross-section for receiving bonding ribbon of rectangular cross-section therethrough, and said gas is forming gas to prevent oxidation of said tip.

4. A bonding tool as described in claim 1 wherein:

said electrodes are elongated members, parallel to each other, and electrically insulated from each other, said connecting means comprise two wires, each having one end fixed adjacent to one end of each of said elongated members, respectively, and an opposite end fixed to said tip, and the other ends of each of said elongated members comprise means for attachment of said tool to a bonding machine.

5. A bonding tool as described in claim 1 wherein:

said heating coil is wound around a form that is electrically insulated from said electrodes, and said shield surrounds substantially all of said coil.

6. A bonding tool as described in claim 1 wherein:

said shield is substantially cylindrical in shape, said means disposing said shield about, and spaced from, said coil comprises insulating anchoring means to fix and to electrically insulate one end of said shield, remote from said tip to said electrodes, and the other end of said shield is formed with said gas outlet to direct said gas over, and past, said tip.

7. A bonding tool as described in claim 1, wherein:

said means communicating with the space between said shield and said heating coil comprises a tube fixed to said shield, adjacent an end of said shield remote from said tip, and communicating through said shield with space adjacent an end of said coil remote from said tip.

8. A method of thermocompression bonding one metal member, supplied adjacent the bonding tip of a bonding tool, to a bonding site of a second metal member, said method comprising the steps of:

applying a bonding force on said tool, toward said bonding site, to press said one metal member into engagement with the second metal member at said bonding site, supplying heat to a portion of said bonding tool to heat said bonding tip by conduction from said position, sending an electric current through said bonding tip to heat it resistively after said bonding site is heated by the conductively heated tip, flowing a gas over said heated portion of said bonding tool to heat said gas, and directing said heated gas to said bonding site to further heat said bonding site when said bonding tool and said one metal member are brought adjacent said bonding site for bonding said one metal member thereto.

9. A method of thermocompression bonding as described in claim 8, wherein:

said one metal member comprises a wire or ribbon fed through an opening in said bonding tip, and said bonding site of said second metal member comprises a portion of an electrical circuit on a substrate.

10. A method of thermocompression bonding as described in claim 8, wherein:

the step of supplying heat to a portion of said bonding tool comprises providing heat conducting means between a heating coil and said bonding tip and supplying an electric current to said heating coil, and the step of directing said heated gas to said bonding site comprises providing a confined path for said gas to flow over said heating coil and directing said path over said bonding tip.

11. A method of thermocompression bonding as described in claim 8 wherein:

the step of directing said heated gas to said bonding site comprises providing a cylindrical shield over, and spaced from, said heated portion of said bonding tool, and introducing a flow of a non-oxidizing gas into the space between said shield and said heated portion of said bonding tool, whereby said non-oxidizing gas is heated and flows over said bonding tip.

* * * * *

UNITED STATES PATENT OFFICE
CERTIFICATE OF CORRECTION

Patent No. 3,838,240 Dated September 24, 1974

Inventor(s) Robert Lindsey Schelhorn

It is certified that error appears in the above-identified patent and that said Letters Patent are hereby corrected as shown below:

Column 5, lines 22-23, "from said position" should read

-- from said portion --.

Signed and sealed this 28th day of January 1975.

(SEAL)
Attest:

McCOY M. GIBSON JR.
Attesting Officer

C. MARSHALL DANN
Commissioner of Patents

FORM PO-1050 (10-69)

USCOMM-DC 60376-P69
U.S. GOVERNMENT PRINTING OFFICE : 869-930